United States Patent
Reitman et al.

(10) Patent No.: US 7,464,007 B2
(45) Date of Patent: Dec. 9, 2008

(54) FLEXIBLE OBJECT REPRESENTATION

(75) Inventors: Michael A. Reitman, Haifa (IL); Leonid Ryvchin, Carcur (IL); Vitaly Kapelevich, Auckland (NZ); Sergey Gurin, Haifa (IL)

(73) Assignee: Parametric Technology Corporation, Needham, MA (US)

( * ) Notice: Subject to any disclaimer, the term of this patent is extended or adjusted under 35 U.S.C. 154(b) by 653 days.

(21) Appl. No.: 10/456,083

(22) Filed: Jun. 5, 2003

(65) Prior Publication Data

US 2004/0010402 A1    Jan. 15, 2004

Related U.S. Application Data (60) Provisional application No. 60/386,272, filed on Jun. 5, 2002.

(51) Int. Cl.
*G06F 7/60* (2006.01)
(52) U.S. Cl. .......................................................... 703/2
(58) Field of Classification Search ...................... 703/2, 703/6, 22
See application file for complete search history.

(56) References Cited

U.S. PATENT DOCUMENTS

| 6,025,849 | A  | * | 2/2000 | Felser et al. .................. 345/441 |
| 6,895,371 | B1 | * | 5/2005 | Ames et al. ...................... 703/1 |
| 2002/0072886 | A1 | * | 6/2002 | Oikawa et al. .................. 703/6 |

OTHER PUBLICATIONS

Getting Started Using ADAM/Car (2000) teaches a Tutorial for creating and simulating car parts in cluding flexible object(p. 1-184).*
Sugiura et al., Trailing Twist Axle Suspension Design Using ADAMS, (Jun. 12-15, 2000).*
Lugner et al., Vehicle System Dynamics, (May 2000).*

* cited by examiner

*Primary Examiner*—Paul L Rodriguez
*Assistant Examiner*—Andre Pierre Louis
(74) *Attorney, Agent, or Firm*—Lahive & Cockfield, LLP (57) ABSTRACT

A flexible object function is for use in conjunction with, or as an element of, a CAD/CAM software application. The flexible object enables the CAD/CAM application to represent an object that can experience variations in its geometry and logical properties for different design occurrences, while maintaining consistent common properties in all of the occurrences. The variations can be driven by the assembly context, or interacting relationships of the specific occurrence with other components or objects.

52 Claims, 7 Drawing Sheets

FLEXIBLE OBJECT REPRESENTATION

RELATED APPLICATION

This application claims priority to, and the benefit of, U.S. Provisional Application No. 60/386,272, filed Jun. 5, 2002, for all subject matter common to both applications. The disclosure of said provisional application is hereby incorporated by reference in its entirety.

FIELD OF THE INVENTION

The present invention relates to CAD/CAM software design applications, and more particularly to a software feature enabling the representation of an object or objects that can have varying geometric and other properties while maintaining the same common properties for all occurrences of the object.

BACKGROUND OF THE INVENTION

A computer-aided design ("CAD") system is a computer implemented tool for engineers and architects to utilize in designing different structures from products to buildings. A similar system, called a computer-aided manufacturing or machining ("CAM") system, is a computer-implemented tool for making design changes to a model and manufacturing or machining the model. The computer portion of the CAD/CAM system conventionally includes a central processing unit, a display device, such as a computer monitor, and a number of input devices such as, a keyboard, a mouse, a light pen, a digitizing tablet, and the like. The central processing unit typically has one or more CAD/CAM software applications installed thereon.

The CAD/CAM software applications allow a user to input and view a design for a particular structure in the form of an object. Each object in a design is often referred to as a design object. The user can often rotate the view of the object to any angle, and also zoom in or zoom out for different views and perspectives. Additional visual features such as highlighting, shading, cross-hatching, and the like, enable the user to design an object with the aid of the computing power inherent in the central processing unit. The CAD/CAM application can also keep track of, and monitor, design changes to the object in addition to design dependencies. This means that when the user adds or changes an element within the object, other values that depend on that change are automatically updated in accordance with engineering concepts and rules of design.

In a number of applications of the CAD/CAM systems, there is often the likelihood that one or more of the objects being modeled has flexible characteristics, or otherwise varying properties. For example, compressible, expandable, bendable, and twistable parts (either individual components or units formed by a number of individual components) may experience a certain amount of flexing, or other changes, as the part is utilized in a larger system. Depending on loads being applied to the parts, materials such as metal, wood, composite, and the like, are designed to flex or change dimension a predetermined amount as the system or device in which the part is installed operates. In addition, other physical changes may result from thermal variations of the parts caused by mechanical action or environmental changes.

In designing devices or systems, there is often the desire to purchase a part from another manufacturer and insert the part into the device or system being designed. For example, if an engineer is designing an automobile, the engineer may wish to purchase the shock absorbers from another manufacturer, rather than create a completely new shock absorber. Such an object, viewed from the enterprise viewpoint, can be referred to as a business object. A business object is any item or product that must be tracked during the life of that project. Because the shock absorber is purchased from a supplier, the entire shock absorber is a single design object in CAD/CAM terminology, and a business object from the viewpoint of an enterprise system. Business objects do not have to be design objects, but can also be other trackable items, such as written documentation or marketing material.

Returning to the flexible objects, it is often necessary to model the flexible object in a plurality of different states to represent how the flexible object interacts with other components and objects in the device or system being modeled. More specifically, returning to the shock absorber example, as the shock absorber experiences a load applied along its axis the shock absorber will compress to absorb the load. As the load is removed, the shock absorber will expand. When the shock absorber is in a compressed state, the overall length of the shock absorber is less than when the shock absorber is in an uncompressed, or marginally compressed, state.

Conventional CAD/CAM applications have approximated the flexible characteristics of such parts as shock absorbers by creating multiple CAD/CAM objects. Each object represents a different state of flex, or in the instance of the shock absorber, a different state of compression. More specifically, the shock absorber may require three or more CAD/CAM objects to be sufficiently represented. A first object represents the shock absorber in a less compressed, or normally loaded, state. A second object represents the shock absorber in a partially compressed state, such as in a fully loaded automobile. A third object represents the shock absorber in a fully compressed state, such as the instant when the fully loaded automobile hits a speed bump. Each of these states can be important in designing the coupling of the shock absorber to other components within the suspension system of the automobile, and their subsequent interaction during the different states of compression as the flexible characteristics of the shock absorber vary.

However, if the flexible object is also a business object, each instance of the object often must be tracked. Therefore, creating a plurality of objects to represent the flexible object in a plurality of states of flex can create difficulties when trying to track the business objects in the system. The system, or the engineer, must make determinations as to which object to track as a business object, and which object is merely a different instance of a previously existing business object. Additional time and resources must be devoted to making these determinations and tracking the appropriate objects of the resulting product.

In addition, some conventional CAD/CAM systems require the engineer to physically create each additional object to show different flex states of a flexible object. The added steps decrease the efficiency of the design process, and therefore increase costs.

Therefore, a need exists for a CAD/CAM application that can represent the same design object in an assembly, system, product, etc., with varying occurrences (i.e., variations of flexible characteristics or properties) and without the creation of additional business objects to represent these occurrences.

SUMMARY OF THE INVENTION

The present invention provides a solution to address the need for a CAD/CAM application that can represent the same design object in an assembly, system, product, and the like, with varying occurrences, but without the creation of additional business objects to represent the occurrences.

In accordance with one embodiment of the present invention, in an electronic device, a method of representing a model includes providing a representation of the model in the form of a flexible object representation, the flexible object representation having at least one variable property and at least one common property. A dynamic process involving the model is then simulated, wherein a value of the at least one variable property changes during simulation and a value of the at least one common property does not change during simulation. A different occurrence of the model is provided with each value of the at least one variable property without creating an additional business object representation of the model.

In accordance with aspects of the present invention, providing a representation of the model includes a user instructing the creation of the flexible object representation of the model. The flexible object representation can have a plurality of properties. The plurality of properties can be classified as the at least one variable property and the at least one common property by determining which of the plurality of properties is a variable property and which of the plurality of properties is a static property.

In accordance with additional aspects of the present invention, the user can provide values for the at least one variable property and at least one common property in the form of at least one of a fixed value and a formula for determining the values. Rules can be provided for association of other objects with the flexible object representation. A method of identification of rule violation can be provided. The at least one variable property can be designated to satisfy the rules for association of other objects with the flexible object representation. Parameters for the at least one variable property can be designated to satisfy the rules for association of other objects with the flexible object representation.

In accordance with additional aspects of the present invention, providing a representation of the model in the form of a flexible object representation includes designating a pre-existing object representation as the flexible object representation. A determination can be made of which properties of the pre-existing object representation to transform into the at least one variable property and designation of the properties as the at least one variable property. A value and/or a formula for determining a value for the at least one variable property can be entered.

In accordance with additional aspects of the present invention, the method further includes determining which properties of the flexible object representation form the at least one variable property. The method can further include entering a value and/or a formula for determining a value for the at least one variable property. Additionally, the method can include creating the different occurrence of the model with each value of the at least one variable property without creating an additional business object representation of the model.

In accordance with another embodiment of the present invention, in an electronic device, a method of representing a model includes providing a representation of the model in the form of a flexible object representation, the flexible object representation having at least one mechanism having a plurality of properties. The method further includes analyzing the mechanism and automatically determining at least one of the plurality of properties to transform into a variable property. The at least one of the plurality of properties is transformed into the variable property. Operation of the model is then simulated, wherein a value of the at least one variable property changes during simulation. A different occurrence of the model is provided with each value of the at least one variable property without creating an additional business object representation of the model.

In accordance with another embodiment of the present invention, a medium holding computer executable steps for a method carried out by an electronic device having an output device is provided. The method is for representing a model and includes providing a representation of the model in the form of a flexible object representation, the flexible object representation having at least one variable property and at least one common property. A dynamic process is simulated involving the model wherein a value of the at least one variable property changes during simulation and a value of the at least one common property does not change during simulation. A different occurrence of the model is provided with each value of the at least one variable property without creating an additional business object representation of the model.

In accordance with another embodiment of the present invention, a medium holding computer executable steps for a method carried out by an electronic device having an output device is provided. The method is for representing a model, and includes providing a representation of the model in the form of a flexible object representation, the flexible object representation having at least one mechanism having a plurality of properties. The mechanism is analyzed, and an automatic determination is made of at least one of the plurality of properties to transform into a variable property. The at least one of the plurality of properties is transformed into the variable property. The operation of the model is simulated, wherein a value of the at least one variable property changes during simulation. A different occurrence of the model is provided with each value of the at least one variable property without creating an additional business object representation of the model.

In accordance with another embodiment of the present invention, a system for representing a model includes a representation of the model in the form of a flexible object representation, the flexible object representation having at least one variable property and at least one common property. A simulation mechanism is further provided for simulating a dynamic process involving the model wherein a value of the at least one variable property changes during simulation and a value of the at least one common property does not change during simulation. A different occurrence of the model is provided with each value of the at least one variable property without creating an additional business object representation of the model.

In accordance with another embodiment of the present invention, a system for representing a model includes a representation of the model in the form of a flexible object representation, the flexible object representation having at least one mechanism having a plurality of properties. An analysis device is provided for analyzing the mechanism and automatically determining at least one of the plurality of properties to transform into a variable property. A transformation tool transforms the at least one of the plurality of properties into the variable property. A simulation device simulates operation of the model wherein a value of the at least one variable property changes during simulation. A different occurrence of the model is provided with each value of the at least one variable property without creating an additional business object representation of the model.

BRIEF DESCRIPTION OF THE DRAWINGS

The features and advantages of the present invention will become better understood with regard to the following description and accompanying drawings, wherein.

DETAILED DESCRIPTION

An illustrative embodiment of the present invention relates to a flexible object function for use in conjunction with, or as an element of, a CAD/CAM software application. The flexible object enables the CAD/CAM application to represent an object that can experience variations in its geometry and logical properties for different design occurrences, while maintaining consistent common properties in all of the occurrences. The variations can be driven by the assembly context, or interacting relationships of the specific occurrence with other components or objects. The common properties are associatively shared between all of the occurrences of the object, and can be modified by the designer or engineer, or by the CAD/CAM application, in all occurrences.

Logical properties are the relationships and attributes of a design object that do not necessarily pertain to the geometry of that design object. Parameters such as cost, or material, will influence the overall projects, but may not affect geometry. Other parameters, such as the outer diameter of the design object, can affect the geometry through relationships and interactions with other objects and components. In general, the parameters can be designated to become the object attributes in the data management system. Also, the logical properties include the relationships between each of the parameters, and between the parameters and the geometry of the objects. An additional class of logical properties can include states, which define specific views of the objects. A view may change the display of the design object, but it does not affect the geometry of the object.

Common properties refer to properties (both geometrical and logical) that are shared between the design object and multiple occurrences (if they exist) of the object in the assembly or system. Generally, all of the properties of an object that are not varied properties (i.e., variable properties that change, thus defining a flexible object) are common properties. The common properties are associatively shared between the object and all of the occurrences of the object. For example, if the object being modeled is a simple spring, the most obvious varied property would be the compression length of the spring (i.e., the outer length of the coiled spring from one end to the other, not the length of the wire forming the spring). All other mechanical properties of the spring could be common to all the occurrences of the spring as it transitioned from an unloaded equilibrium state to a loaded compressed state. Thus, essentially all other properties of the spring are common properties. If, for example, the diameter of the spring were modified in the object, or the length of the wire forming the spring were lengthened, the diameter or length would automatically be updated for each of the occurrences as well. It should additionally be noted that if a property is not variable, but is a common property, that property is also static in that it does not change during object modeling or process simulation.

FIGS. 1 through 6, wherein like parts are designated by like reference numerals throughout, illustrate example embodiments of a flexible object feature within a CAD/CAM application according to the teachings of the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed in a manner still in keeping with the spirit and scope of the present invention.

The present invention relates to the use of a flexible object feature in a CAD/CAM type of software application. The term flexible, as utilized herein, is intended to refer not only to the physical act of an object, such as a spring, flexing, bending, compressing, etc. with a load applied thereto. The term flexible is additionally intended to refer to other characteristics or properties of an object being varied due to an internal or external change experienced by the object. Therefore, an object that experiences a variation in at least one property or characteristic, and therefore can have more than one occurrence, can be considered a flexible object as referred to herein.

One or more objects in a CAD/CAM design application can combine to represent a model. The objects can be identified as regular objects having static properties or as flexible objects having varied properties. Looking at FIG. 1, the process for creating a flexible object can be executed as follows and in accordance with one embodiment of the present invention. An instruction originates for the creation of a flexible object (step 20). The instruction can be automated, such as originating from another CAD/CAM or other software application. The instruction can also originate with a user of the CAD/CAM application. For example, using a graphical user interface (GUI), the user can interact with the CAD/CAM application to construct a flexible object within a model. A complete editing process can provide the ability to add, remove, or modify a flexible object.

Figure 1:
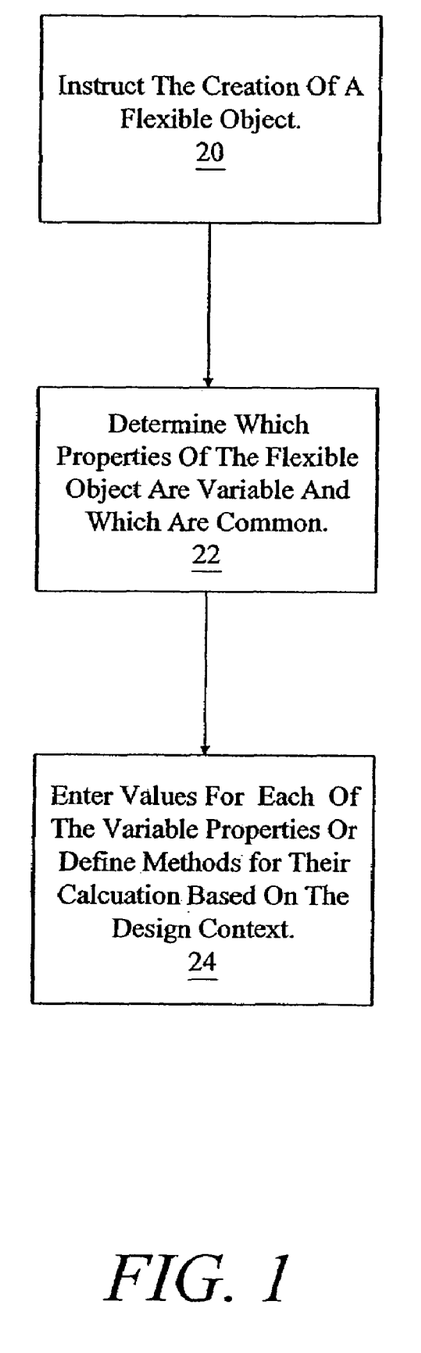
FIG. 1 is a flowchart showing the creation of a flexible object in a CAD/CAM application according to one aspect of the present invention.

When a component is classified a flexible object, interactive user interface is provided to allow selection and modification of varied properties of the flexible object. The varied properties can include such characteristics as dimensions, features, locations, positions, and the like. In addition, some standardized flexible objects can be chosen from a predetermined list of flexible objects. The varied properties of the standardized flexible objects can be provided automatically by the application. Further, the user can have access to add, modify, or remove any of the varied properties. For example, a user can specify a standardized flexible object. The CAD/CAM application provides the flexible object and can also provide automated definition of the varied properties. The automated definition of varied properties can be based upon object placement in the model or assembly, results of measurement and geometry analysis, and/or results of structure and motion analysis.

Dependant upon whether the user has selected a standardized flexible object, or is creating a new flexible object, a determination must be made as to which properties of the flexible object are variable, and which properties are common (step 22). As mentioned previously, if the flexible object is a standardized flexible object (for example, a shock absorber) then the object may automatically include at least one varied property. In the example of a shock absorber, the compression length of the shock absorber represents an appropriate varied property. Therefore, the shock absorber object can automatically be designated as a flexible object with the compression length being the varied property. The user can then decide whether to keep the compression length as a varied property, or to remove the varied property designation and make the compression length a common property that does not change. This may be useful, for example, in simulating the shock absorber jamming and no longer compressing with design loads applied thereto.

Alternatively, the CAD/CAM system can identify the flexible properties automatically and make suggestions to the user based on the design context. For example, looking at the mechanism definition or the placement of the object in the assembly, the CAD/CAM system (or an associated application) can automatically identify the varied properties based on the design context. Thus, the flexible properties can be either determined by the user or suggested by the CAD/CAM system or associated application based on the context of usage of the object in the design.

Figure 2A:
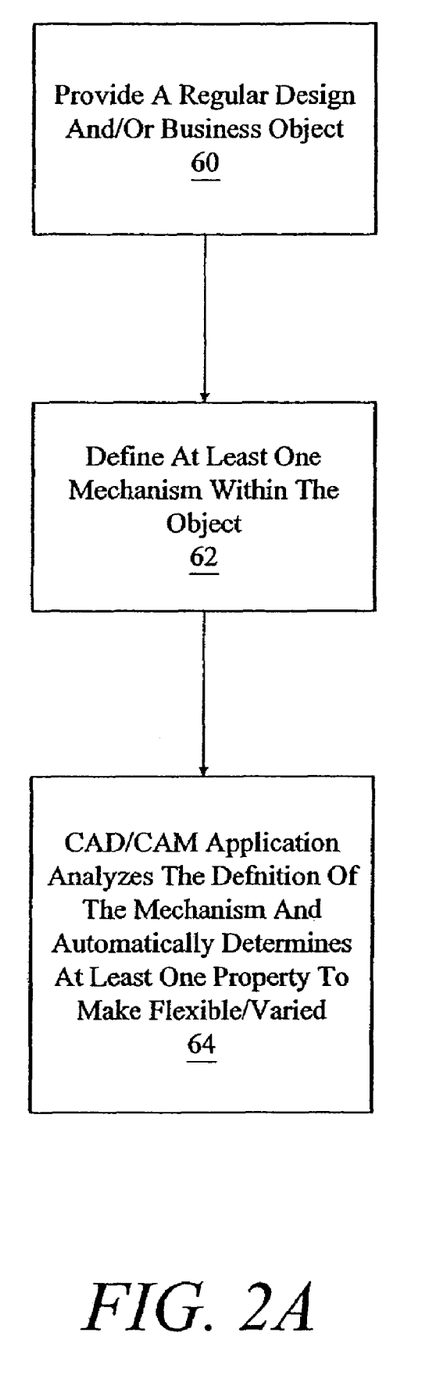
FIG. 2A is a flowchart showing an example process executed by the CAD/CAM system to determine appropriate properties of an object to designate as varied properties.

FIG. 2A illustrates an example process executed by the CAD/CAM system to determine appropriate properties of a design or business object to designate as varied properties. Initially, a user provides a regular design object or business object as a part of a model (step 60). The object can be singular or can incorporate a number of different components and elements. As a part of the design process, the user designates one or more elements or components of the object as a mechanism (step 62). Example mechanisms can include hinges, sliders, cylinder mechanisms, pivoting mechanisms, rotating mechanisms, sliding mechanisms, bending mechanisms, or the like. Upon designation of a mechanism, the CAD/CAM application automatically determines what properties of the object should become flexible (varied properties) to satisfy the design intent (the intent being a moving part) and design parameters (step 64).

Figure 2B:
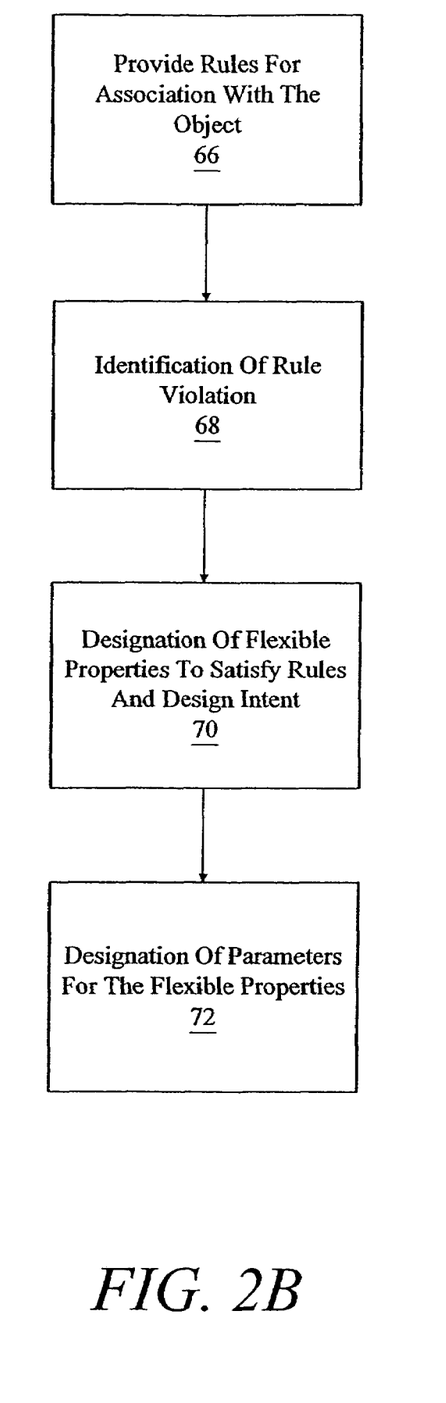
FIG. 2B is a flowchart showing further detail regarding an example process executed by the CAD/CAM application to automatically determine what properties of the object should become varied properties.

FIG. 2B provides further detail regarding an example process executed by the CAD/CAM application to automatically determine what properties of the object should become flexible, i.e., varied properties. In the illustrative example of a shock absorber, the user can provide one or more rules to be associated with the placement and/or function of the object (step 66). In the illustrative example, the user defines the shock absorber object as an object that should always be placed inside another unit without offsets from other components. This additional parameter is merely an example. The shock absorber is typically densely mated with surrounding components because of its spring characteristics. There must be some structure at either end of the shock absorber to hold it in place and to generate the compressive forces received by the shock absorber. It may be the case that upon insertion of the shock absorber object into an existing assembly of a model a distance exists between the shock absorber and surrounding components. The CAD/CAM application identifies this violation of the rules defined by the user (step 68). The rules associated with a particular object can be defined by the user, or can be predetermined as a part of an existing library of flexible objects. The CAD/CAM application analyzes the rule violation, and automatically designates which property or properties of the object (e.g., the shock absorber) must become flexible properties to satisfy the design intent and the rules associated with the object (step 70). The CAD/CAM application can further define parameters for the varied properties of the newly defined flexible object to further satisfy the particular placement of the object within the assembly model (step 72).

In addition, the user can decide whether to transform any common properties provided with the object into varied properties. For example, accelerated and repeated flexing of the example shock absorber can cause some increase in temperature of the shock absorber due to friction. The heat can cause internal pieces of the shock absorber to respond in a predictable manner. Therefore, the user has the ability define the internal temperature of the shock absorber as a varied property affected by environment temperature and frequency and speed of compressions. The user can also define the range of allowable temperatures and the resulting influence of temperature on the movement of the shock absorber. The user provides these variables and the user enters values for each of the varied properties and each of the common properties to define the state of the flexible object (step 24). The user can also define methods for calculating the value of the varied property or properties. The methods may represent the measurement between geometries, relations, programs, or another application logic that calculates and sets the values of the varied property according to the current parameters of the design.

Once the properties are defined as either common or varied, the user also provides the allowable range for the varied properties. The user, or associated application to the CAD/CAM system, indicates an upper limit and a lower limit for the varied property variable(s). Again, additional parameters such as an expression for defining the change of the varied property over the allowed range can be provided.

The variability of the varied properties defines, at least in part, the flexible objects. Some example varied properties can include dimensions, tolerances, parameters, features, components, assembly placement constraints, associative references to other components, material properties, thermal constants, thermal properties, and other properties that may have a bearing on how a particular component acts or responds as understood by one of ordinary skill in the art.

The user can then proceed with modeling the flexible object, running through different occurrences of the flexible object as different internal and external factors are applied to the flexible object. Throughout the modeling process, there is only one business object for each flexible object, yet there can be a number of occurrences of that object. The common properties stay the same for each occurrence of each flexible object, while the varied properties change for each occurrence of each flexible object.

Figure 3:
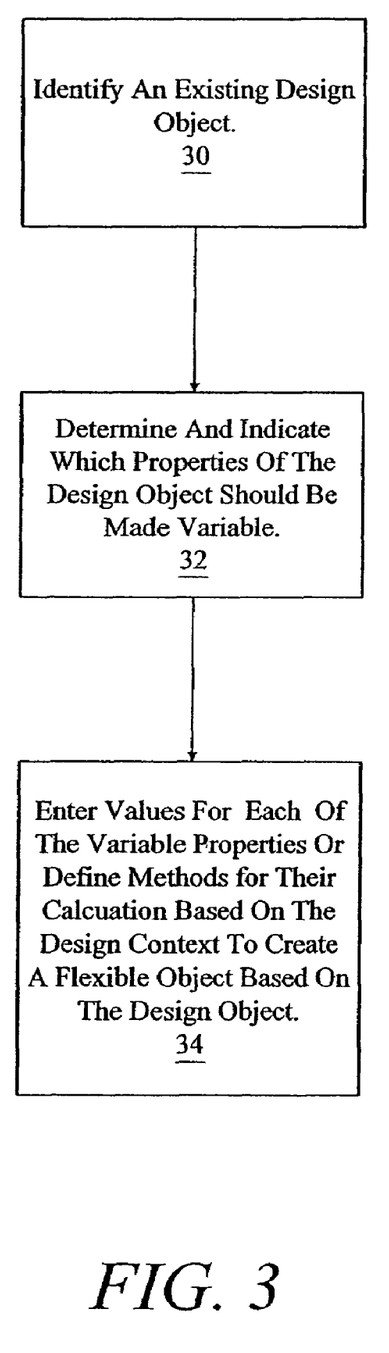
FIG. 3 is a flowchart showing the re-characterization of an existing object as a flexible object in a CAD/CAM application according to one aspect of the present invention.

Turning now to FIG. 3, the teachings of the present invention also enable the transformation of an existing design object into a flexible object with one or more varied properties. During a design process, a number of different components may be combined in an ongoing design implementation. As the model further develops, the user or designer may wish to modify an existing design object to transition the object into a flexible object.

For example, a user may utilize a CAD/CAM application to model a platform. The user may then wish to analyze the loading of the platform with a several ton truck. The user can identify one or more supports or beams of the platform as design objects that will experience a variation due to the loading of the truck (step 30). The user then makes a determination as to which properties of the design object will vary, such as the flexing of a horizontal beam of the platform experiencing the vertical downward pressure from the several ton truck (32). The flexing of a horizontal beam can be determined utilizing conventional mechanics of materials equations, given the material properties and dimensions of the beam. The values of the varied property of the flex of the beam are entered into to the CAD/CAM application to transition the design object horizontal beam into a flexible object (step 34). The user can then make further design modifications, if required, upon varying the flexible object properties of the platform. In addition, the user can define methods for calculating the value of the varied property or properties. The methods may represent the measurement between geometries, relations, programs, or another application logic that calculates and sets the values of the varied property according to the current parameters of the design.

Figure 4:
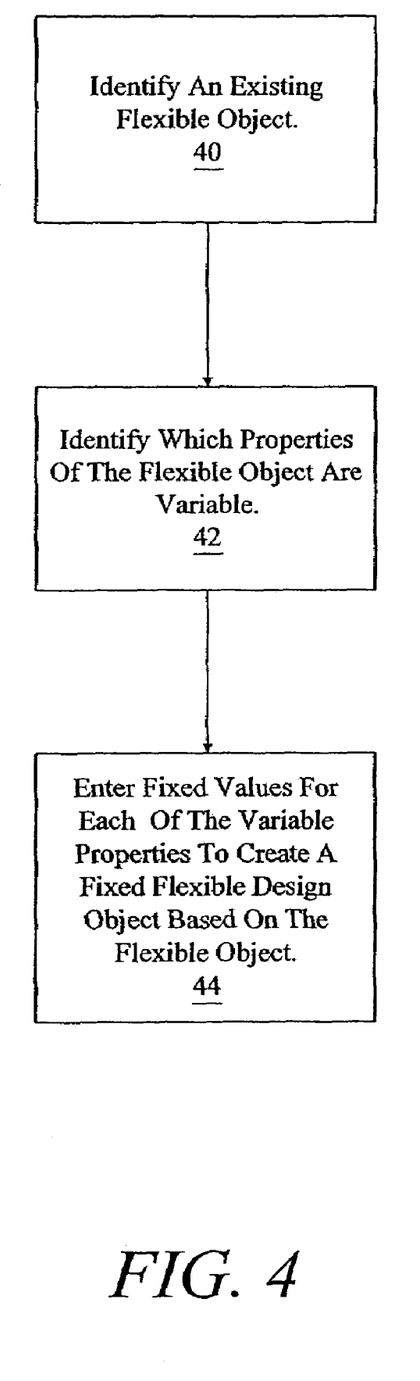
FIG. 4 is a flowchart showing the re-characterization of an existing flexible object as a regular design object according to one aspect of the present invention.

FIG. 4 illustrates another variation of the teachings of the present invention. Returning to the example of the shock absorber, the CAD/CAM application can be programmed to enable the user to introduce the shock absorber to a model as a predetermined flexible object. The user can continue with the modeling process, but may at some later point desire the shock absorber to act as a conventional design object. As previously mentioned, the user may wish to model a suspension system where the shock absorber has frozen and does not compress according to design. The user can therefore identify the shock absorber as a flexible object that should be modified to be a fixed flexible object (step 40). Assuming the shock absorber has a varied property embodied as, e.g., a variable compression length, the user identifies this property as one that should not vary when modeling the shock absorber as malfunctioning and frozen in place (step 42). The user then enters the fixed values for the length of the shock absorber to create a non-flexible, or static, fixed flexible object based on the original flexible object shock absorber (step 44). Alternatively for step 44, the user can undesignate the varied properties, such as the compression length of the shock absorber. The act of un-designating the varied properties effectively transforms the un-designated varied properties into common properties that do not change from occurrence to occurrence. If all varied properties of a flexible object are un-designated (i.e., removed from the list of variable characteristics) the flexible object becomes a regular design object with only common properties that are identical for all occurrences of the object.

Figure 5:
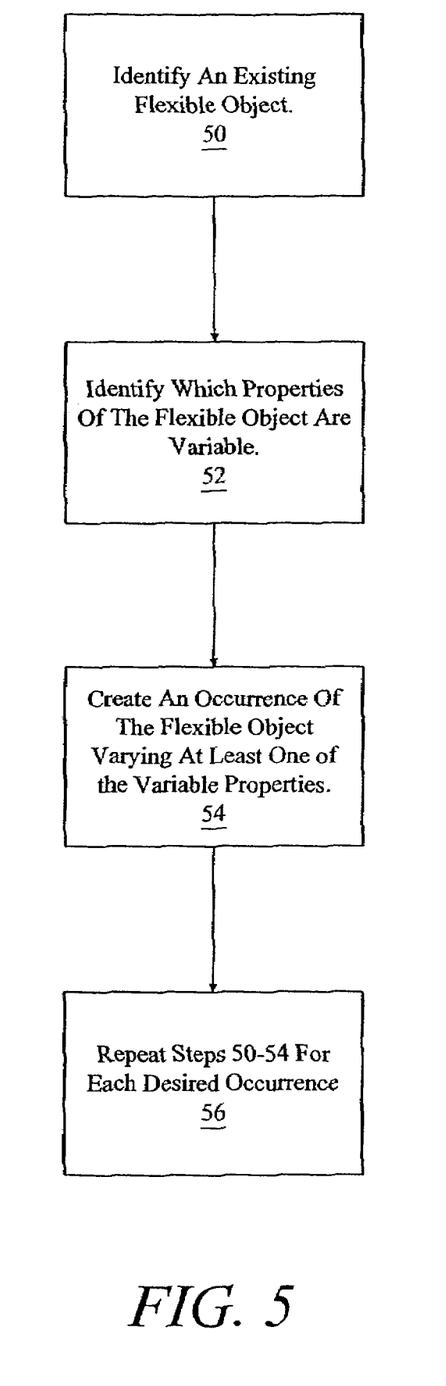
FIG. 5 is a flowchart illustrating the creation of multiple occurrences by the CAD/CAM application according to one aspect of the present invention.

Once a model having at least one flexible object has been created in a CAD/CAM application, the user can perform a variety of analysis and design functions as the particular device or product being modeled is developed. FIG. 5 illustrates one example embodiment of the present invention as multiple occurrences are created for a single flexible object. At some point prior to the creation of multiple occurrences, the flexible object must be identified as a flexible object (step 50). This can be done in any of the above methods described herein for creating or identifying a flexible object, in addition to other methods as would be understood by one of ordinary skill in the art. The CAD/CAM application must then recognize the particular variable or variables that relate to the varied properties of the flexible object, so that the variable or variables can be varied (step 52). The CAD/CAM application is instructed, either by the user or by another application or instruction, to carry out a simulation or to otherwise vary at least one of the varied properties of the flexible object to create a new occurrence of the flexible object (step 54). This feature allows the user and the CAD/CAM system to make various design assessments and potential modifications, as understood by one of ordinary skill in the art. Each time the varied property or properties of the flexible object vary, the varied property results in a new occurrence, and a repetition of the above steps (step 56). There can be a number of different occurrences for each flexible object. Each occurrence represents the flexible object in a different state. There can be a number of different occurrences based on a single flexible object. The creation of different occurrences for representing the object in different states negates the necessity to create different objects for each state the user desires to simulate. The varied property or properties change, but the common property or properties remain the same for each occurrence of the flexible object.

Further, there is only a need for the creation of one business object to represent a particular component or object. A component or object can be singular, or can result from a combination of elements forming units. The business object then serves as a basis for representing multiple states of the business object in the form of multiple occurrences. The ability to base multiple occurrences on a single business object simplifies the tracking of the business objects. There is no longer a need for creating multiple business objects to represent a single component in multiple states within a CAD/CAM application.

Figure 6:
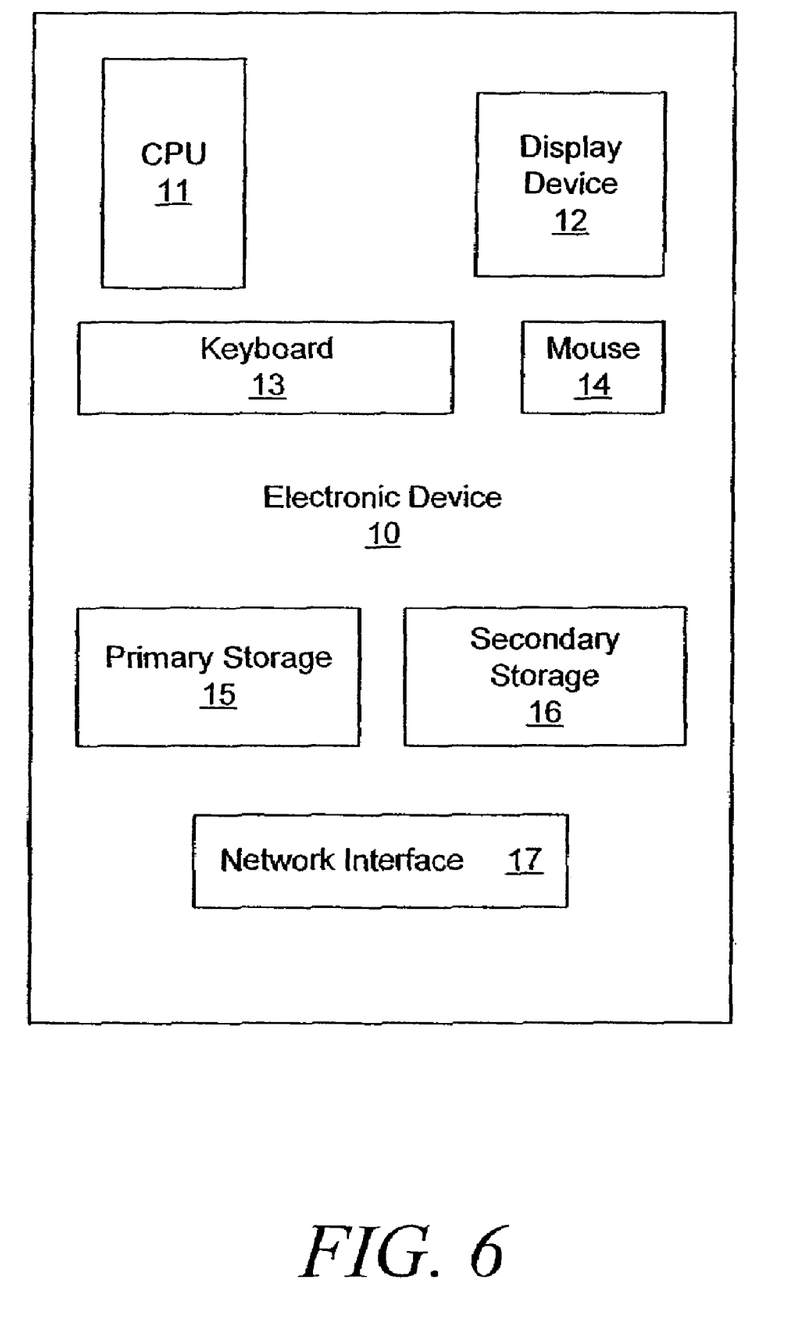
FIG. 6 is a diagrammatic illustration of an electronic device for executing the method of present invention.

FIG. 6 illustrates one example embodiment of an electronic device 10 suitable for practicing the illustrative embodiment of the present invention. The electronic device 10 is representative of a number of different technologies, such as personal computers (PCs), laptop computers, workstations, personal digital assistants (PDAs), Internet appliances, cellular telephones, and the like. In the illustrated embodiment, the electronic device 10 includes a central processing unit (CPU) 11 and a display device 12. The display device 12 enables the electronic device 10 to communicate directly with a user through a visual display. The electronic device 10 further includes a keyboard 13 and a mouse 14. Other potential input devices not depicted include a stylus, trackball, joystick, touch pad, touch screen, and the like. The electronic device 10 includes primary storage 15 and secondary storage 16 for storing data and instructions. The storage devices 15 and 16 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 15 and 16. The electronic device 10 also includes a network interface 17 for communicating with one or more electronic devices external to the electronic device 10 depicted. A modem (not shown) is one form of establishing a connection with an external electronic device or network. The CPU 11 has either internally, or externally, attached thereto one or more of the aforementioned components.

Flexible components enable the creation of components having the same name, but having different shapes. More specifically, each occurrence of a flexible object component can maintain a different shape relative to other occurrences of the same component as the component is shown, for example, flexing. The different shapes are defined by one or more varied properties as defined. The properties will often represent, for example, dimensions and features. The status of varied properties can be defined based on input from, for example, a user or an associated application. The final values of the varied properties are also definable by the user or an associated application. Flexible objects or components are not stored as separate objects for each occurrence. Rather, there is a single object having multiple occurrences. Each of the occurrences refers to the original object associatively. Flexible objects are definable during assembly of a model or component, or at a later point after initial assembly.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the invention, and exclusive use of all modifications that come within the scope of the appended claims is reserved.

What is claimed is:

1. In an electronic device, a method of representing a model, comprising:
   creating and storing a business object representation occurrence of the model comprising a flexible object representation occurrence of the model, the flexible object representation occurrence having at least one variable property and at least one common property; and
   simulating a dynamic process involving the model wherein a value of the at least one variable property changes during simulation and a value of the at least one common property does not change during simulation, resulting in creation of a plurality of flexible object representation occurrences of the model, displaying a representation of the model which includes the plurality of flexible object representation occurrences of the model;
   wherein following simulating the dynamic process, the stored business object representation occurrence of the model comprises the plurality of flexible object representation occurrences of the model.

2. The method of claim 1, wherein creating and storing a business object representation occurrence of the model comprises a user instructing the creation of the flexible object representation of the model.

3. The method of claim 1, wherein the flexible object representation occurrence has a plurality of properties.

4. The method of claim 3, further comprising classifying the plurality of properties as the at least one variable property and the at least one common property by determining which of the plurality of properties is a variable property and which of the plurality of properties is a static property.

5. The method of claim 1, further comprising a user providing values for the at least one variable property and at least one common property in the form of at least one of a fixed value and a formula for determining the values.

6. The method of claim 1, further comprising providing rules for association of other objects with the flexible object representation occurrence.

7. The method of claim 6, further comprising providing a method of identification of rule violation.

8. The method of claim 7, further comprising designating the at least one variable property to satisfy the rules for association of other objects with the flexible object representation occurrence.

9. The method of claim 8, further comprising designating parameters for the at least one variable property to satisfy the rules for association of other objects with the flexible object representation occurrence.

10. The method of claim 1, wherein the flexible object representation occurrence results from designating a pre-existing object representation as the flexible object representation occurrence.

11. The method of claim 10, further comprising determining which properties of the pre-existing object representation occurrence to transform into the at least one variable property and designating the properties as the at least one variable property.

12. The method of claim 11, further comprising entering at least one of a value and a formula for determining a value for the at least one variable property.

13. The method of claim 1, further comprising determining which properties of the flexible object representation occurrence form the at least one variable property.

14. The method of claim 13, further comprising entering at least one of a value and a formula for determining a value for the at least one variable property.

15. In an electronic device, a method of representing a model, comprising:
   creating and storing a business object representation occurrence of the model in the form of a flexible object representation occurrence of the model, the flexible object representation occurrence having at least one mechanism having a plurality of properties;
   analyzing the at least one mechanism and automatically determining at least one of the plurality of properties to transform into a variable property;
   transforming the at least one of the plurality of properties into the variable property; and
   simulating operation of the model wherein a value of the at least one variable property changes during simulation, resulting in creation of a plurality of flexible object representation occurrences of the model, displaying a representation of the model which includes the plurality of flexible object representation occurrences of the model;
   wherein following simulating the dynamic process, the stored business object representation occurrence of the model comprises the plurality of flexible object representation occurrences of the model.

16. The method of claim 15, wherein determining at least one of the plurality of properties to transform into a variable property comprises a user instructing the creation of the flexible object representation occurrence of the model.

17. The method of claim 15, wherein the flexible object representation occurrence further comprises at least one common property that remains static during simulation of a dynamic process involving the model.

18. The method of claim 15, further comprising a user providing values for the variable property in the form of at least one of a fixed value and a formula for determining the values.

19. The method of claim 15, further comprising providing rules for association of other objects with the flexible object representation occurrence.

20. The method of claim 19, further comprising providing a method of identification of rule violation.

21. The method of claim 20, further comprising designating the variable property to satisfy the rules for association of other objects with the flexible object representation occurrence.

22. The method of claim 21, further comprising designating parameters for the variable property to satisfy the rules for association of other objects with the flexible object representation occurrence.

23. The method of claim 15, wherein the flexible object representation occurrence results from designating a pre-existing object representation as the flexible object representation occurrence.

24. The method of claim 23, further comprising determining which properties of the pre-existing object representation to transform into the variable property and designating the properties as the variable property.

25. The method of claim 24, further comprising entering at least one of a value and a formula for determining a value for the variable property.

26. A computer readable medium holding computer executable steps for a method carried out by an electronic device having an output device, the method for representing a model and comprising:
creating and storing a business object representation occurrence of the model in the form of a flexible object representation occurrence, the flexible object representation occurrence having at least one variable property and at least one common property; and
simulating a dynamic process involving the model wherein a value of the at least one variable property changes during simulation and a value of the at least one common property does not change during simulation, resulting in creation of a plurality of flexible object representation occurrences of the model, displaying a representation of the model which includes the plurality of flexible object representation occurrences of the model;
wherein following simulating the dynamic process, the stored business object representation occurrence of the model comprises the plurality of flexible object representation occurrences of the model.

27. The medium of claim 26, wherein creating a business object representation occurrence of the model comprises a user instructing the creation of the flexible object representation occurrence of the model.

28. The medium of claim 26, wherein the flexible object representation occurrence has a plurality of properties.

29. The medium of claim 28, further comprising classifying the plurality of properties as the at least one variable property and the at least on common property by determining which of the plurality of properties is a variable property and which of the plurality of properties is a static property.

30. The medium of claim 26, further comprising a user providing values for the at least one variable property and at least one common property in the form of at least one of a fixed value and a formula for determining the values.

31. The medium of claim 26, further comprising providing rules for association of other objects with the flexible object representation occurrence.

32. The medium of claim 31, further comprising providing a method of identification of rule violation.

33. The medium of claim 32, further comprising designating the at least one variable property to satisfy the rules for association of other objects with the flexible object representation occurrence.

34. The medium of claim 33, further comprising designating parameters for the at least one variable property to satisfy the rules for association of other objects with the flexible object representation occurrence.

35. The medium of claim 26, wherein the flexible object representation results from designating a pre-existing object representation as the flexible object representation occurrence.

36. The medium of claim 35, further comprising determining which properties of the pre-existing object representation to transform into the at least one variable property and designating the properties as the at least one variable property.

37. The medium of claim 36, further comprising entering at least one of a value and a formula for determining a value for the at least one variable property.

38. The medium of claim 26, further comprising determining which properties of the flexible object representation occurrence form the at least one variable property.

39. The medium of claim 38, further comprising entering at least one of a value and a formula for determining a value for the at least one variable property.

40. A computer readable medium holding computer executable steps for a method carried out by an electronic device having an output device, the method for representing a model and comprising:
creating and storing a business object representation occurrence of the model in the form of a flexible object representation occurrence, the flexible object representation occurrence having at least one mechanism having a plurality of properties;
analyzing the mechanism and automatically determining at least one of the plurality of properties to transform into a variable property;
transforming the at least one of the plurality of properties into the variable property; and
simulating operation of the model wherein a value of the at least one variable property changes during simulation, resulting in creation of a plurality of flexible object representation occurrences of the model, displaying a representation of the model which includes the plurality of flexible object representation occurrences of the model;
wherein following simulating the dynamic process, the stored business object representation occurrence of the model comprises the plurality of flexible object representation occurrences of the model.

41. The medium of claim 40, wherein determining at least on of the plurality of properties to transform into a variable property comprises a user instructing the creation of the flexible object representation occurrence of the model.

42. The medium of claim 40, wherein the flexible object representation occurrence further comprises at least one common property that remains static during simulation of a dynamic process involving the model.

43. The medium of claim 40, further comprising a user providing values for the variable property in the form of at least one of a fixed value and a formula for determining the values.

44. The medium of claim 40, further comprising providing rules for association of other objects with the flexible object representation occurrence.

45. The medium of claim 44, further comprising providing a method of identification of rule violation.

46. The medium of claim 45, further comprising designating the variable property to satisfy the rules for association of other objects with the flexible object representation occurrence.

47. The medium of claim 46, further comprising designating parameters for the variable property to satisfy the rules for association of other objects with the flexible object representation occurrence.

48. The medium of claim 40, wherein the flexible object representation occurrence results from designating a pre-existing object representation as the flexible object representation occurrence.

49. The medium of claim 48, further comprising determining which properties of the pre-existing object representation to transform into the variable property and designating the properties as the variable property.

50. The medium of claim 49, further comprising entering at least one of a value and a formula for determining a value for the variable property.

51. A system for representing a model, comprising:
a business object representation occurrence of the model stored in a memory in the form of a flexible object representation occurrence, the flexible object representation occurrence having at least one variable property and at least one common property; and
a simulation mechanism including a processor for simulating a dynamic process involving the model wherein a value of the at least one variable property changes during simulation and a value of the at least one common property does not change during simulation, resulting in creation of a plurality of flexible object representation occurrences of the model, displaying a representation of the model which includes the plurality of flexible object representation occurrences of the model;
wherein following simulating the dynamic process, the stored business object representation occurrence of the model comprises the plurality of flexible object representation occurrences of the model.

52. A system for representing a model, comprising:
a business object representation occurrence of the model stored in a memory in the form of a flexible object representation occurrence, the flexible object representation occurrence having at least one mechanism having a plurality of properties;
an analysis device for analyzing the mechanism and automatically determining at least one of the plurality of properties to transform into a variable property;
a transformation tool for transforming the at least one of the plurality of properties into the variable property; and
a simulation device including a processor for simulating operation of the model wherein a value of the at least one variable property changes during simulation, resulting in creation of a plurality of flexible object representation occurrences of the model, displaying a representation of the model which includes the plurality of flexible object representation occurrences of the model;
wherein following simulating the dynamic process, the stored business object representation occurrence of the model comprises the plurality of flexible object representation occurrences of the model.

* * * * *